US012534798B2

(12) United States Patent
Fisher et al.

(10) Patent No.: US 12,534,798 B2
(45) Date of Patent: Jan. 27, 2026

(54) METHOD OF COATING A CHAMBER COMPONENT

(71) Applicant: Applied Materials, Inc., Santa Clara, CA (US)

(72) Inventors: Kirk Allen Fisher, Tempe, AZ (US); John Ford, Tempe, AZ (US); James M. Amos, Apache Junction, AZ (US); Hui Chen, Tempe, AZ (US); Shawn Joseph Bonham, Mesa, AZ (US); Xinning Luan, Tempe, AZ (US); Philip Michael Amos, Apache Junction, AZ (US); Aimee S. Erhardt, Tempe, AZ (US); Cathryne A. Ryan, Minden, NV (US); Michael R. Riordan, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/813,829

(22) Filed: Jul. 20, 2022

(65) Prior Publication Data

US 2024/0026530 A1 Jan. 25, 2024

(51) Int. Cl.

| | |
|---|---|
| ***C23C 16/458*** | (2006.01) |
| ***C23C 16/02*** | (2006.01) |
| ***C23C 16/32*** | (2006.01) |

(52) U.S. Cl.

CPC ........ *C23C 16/325* (2013.01); *C23C 16/0209* (2013.01); *C23C 16/4581* (2013.01)

(58) Field of Classification Search

None

See application file for complete search history.

(56) References Cited

U.S. PATENT DOCUMENTS

| | | | |
|---|---|---|---|
| 2017/0275777 A1 | 9/2017 | Collins et al. | |
| 2017/0345624 A1 | 11/2017 | Kim et al. | |

FOREIGN PATENT DOCUMENTS

| | | | | |
|---|---|---|---|---|
| EP | 1132950 A1 * | 9/2001 | ........ C23C 16/45504 |
| EP | 2918702 A1 * | 9/2015 | ......... C23C 16/4581 |
| JP | 2004063779 A * | 2/2004 | ........ C23C 16/45521 |
| JP | 2016011243 A | 1/2016 | |
| KR | 20110116912 A | 10/2011 | |
| KR | 20120133870 A * | 12/2012 | |
| KR | 2014067790 A * | 6/2014 | |
| WO | 2005003404 A2 | 1/2005 | |

OTHER PUBLICATIONS

"AFTech: Creating The Killer Coating", Sep. 27, 2021—https://compoundsemiconductor.net/article/113653/AFTech_Creating_the_killer_coating.

International Search Report and Written Opinion dated Oct. 17, 2023 for Application No. PCT/US2023/025465.

* cited by examiner

*Primary Examiner* — David P Turocy

(74) *Attorney, Agent, or Firm* — Patterson + Sheridan, LLP

(57) ABSTRACT

Embodiments disclosed herein include to a component support for use in coating chamber components via chemical vapor deposition (CVD). The component support includes contact rods configured to contact chamber components at fixture points located on the backside of the chamber components. The component supports are configured to support the chamber components in the processing volume with minimal contact of the chamber components. The fixture points on the backside reduce exposure of the fixture points to reactant gases when the chamber components are installed.

6 Claims, 8 Drawing Sheets

METHOD OF COATING A CHAMBER COMPONENT

BACKGROUND

Field

Embodiments of the present disclosure generally relate to coating the chamber component with a carbon-containing material in a chemical vapor deposition (CVD) chamber, and a support for holding the chamber component during the same.

Description of the Related Art

The components that form processing chambers utilized during the manufacture of semiconductor substrates may go through a wide variety of processing steps in order to be ready for use. In some processes, the chamber components, such as susceptors and pre-heat rings, undergo a CVD process to coat the components with a desired material. However, during the CVD process, it may be challenging to effectively coat each location of the components, which may adversely impact the component service life, and can additionally create weak spots on the body of the components.

Thus, there is a need for improved method for coating chamber components using a CVD process.

SUMMARY

In one embodiment, a method of coating a chamber component is provided. The method includes positioning a chamber component on a component support in a chamber body. One or more contact rods extend from the component support to only contact a backside of the chamber component at one or more fixture points and the one or more fixture points are defined by one or more slots formed in the backside of the chamber component. The method further includes coating the chamber component with a carbon-containing material while the chamber component is supported on the component support. The backside of the chamber component is facing a bottom surface of the chamber body.

In another embodiment, a method of coating a chamber component is provided. The method includes positioning a chamber component on a component support in a chamber body. One or more contact rods extend from a support rod of the component support to contact the chamber component at one or more fixture points. The chamber component includes an inner portion forming a ring shape and an outer portion surrounding the inner portion. The inner portion extends away from the outer portion to form a ledge such that the one or more fixture points are located on a corner formed on the chamber component and the corner is defined as an intersection of the ledge and the inner portion. The method further includes coating the chamber component with a carbon-containing material while the chamber component is supported on the component support. The chamber component is facing a bottom surface of the chamber body.

In yet another embodiment, a semiconductor processing chamber component support is provided. The semiconductor processing chamber component support includes a base, one or more legs coupled to the base, and the legs extending away from a top surface of the base. The semiconductor processing chamber component support further includes a support rod coupled to the base and the support rod extending away from the top surface of the base. The semiconductor processing chamber component support further includes a support bar coupled to the legs and contact rods coupled to the support rod and a side surface of the support rod. The contact rods each include contact points configured to contact a backside of a chamber component.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a method for coating a chamber component in a chemical vapor deposition (CVD), and a component support suitable for supporting the chamber component while the chamber component is being coated. After undergoing a CVD coating processes, chamber components (such as, susceptors, preheat rings, among other chamber components) may have thinner coating at locations that come in contact with a fixture (e.g., component support). The locations having thinner coating are more susceptible to stress than other locations of the chamber component. When the chamber components are in use for substrate manufacturing such as within a CVD processing chamber, reactant gas may interact with the regions of thinner coating, and thus damage the coating and adversely affect the service life of the chamber components. The component supports described herein advantageously are configured to have fixture points that support the chamber components while being coated that contact the chamber component in locations of the chamber components that are selected to reduce the risk of part failure at the locations that contact the chamber component.

Figure 1:
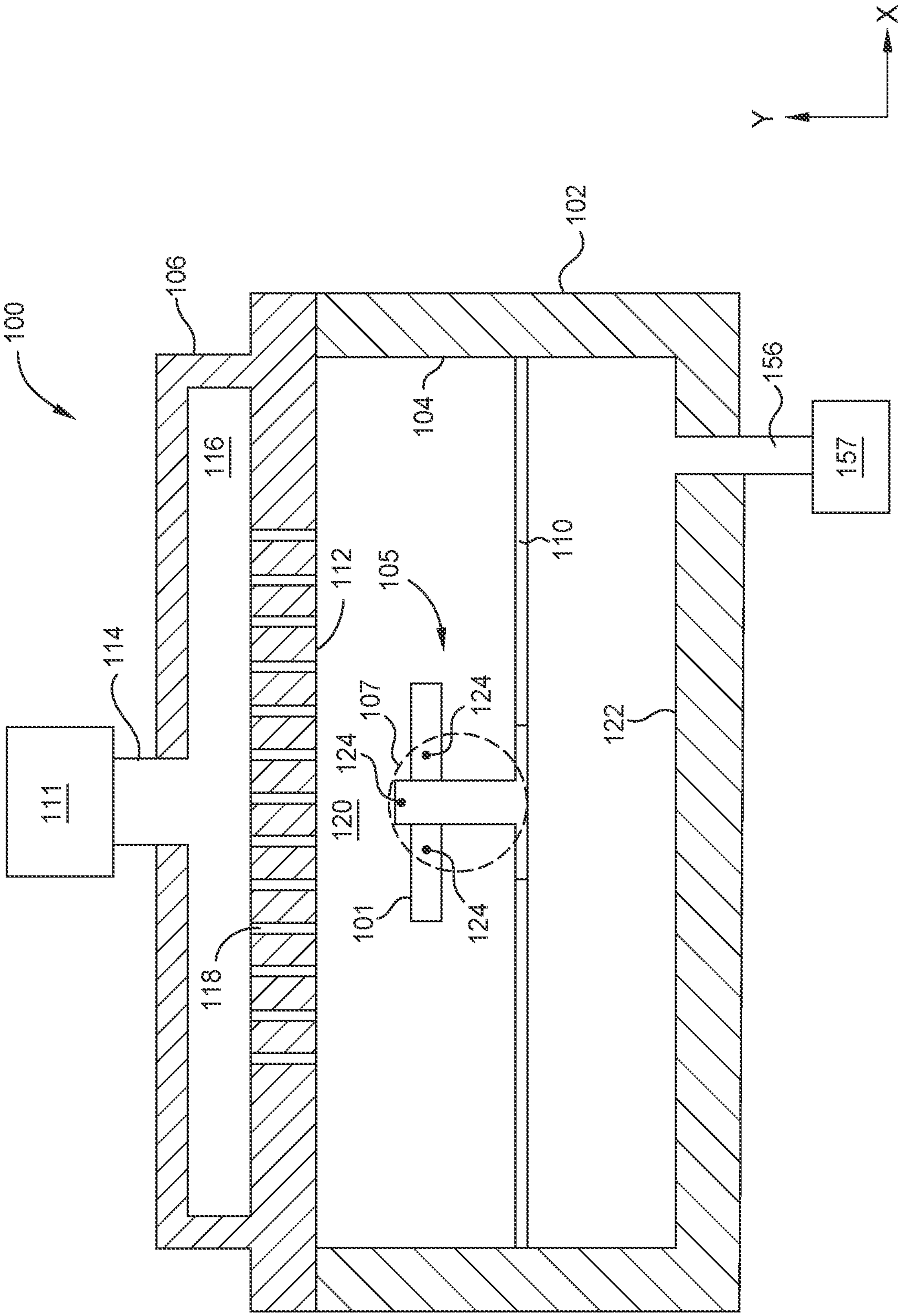
FIG. 1 is a schematic cross-sectional view of a chamber component coating (CCC) chamber with a first example of a component support according to embodiments described herein.
Figure 2:
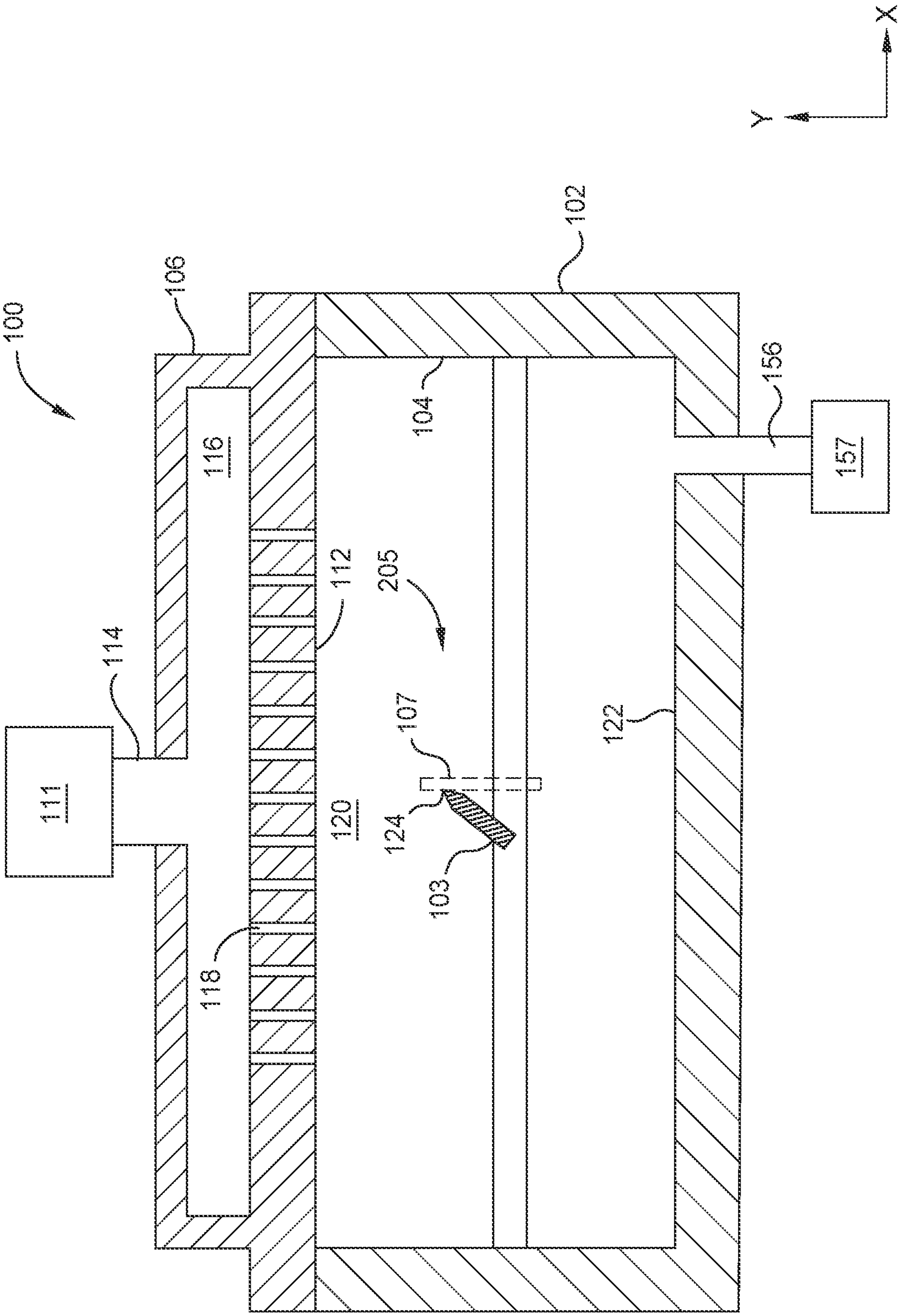
FIG. 2 is a schematic cross-sectional view of a chamber component coating (CCC) chamber with a second example of a component support according to embodiments described herein.

FIG. 1 is a schematic cross-sectional view of a chamber component coating (CCC) chamber with a first example of a component support according to embodiments described herein. The CCC chamber 100 is configured to apply a coating of material on a chamber component, such as chamber components utilized in semiconductor processing chambers like chemical vapor deposition (CVD) chambers, physical vapor deposition (PVD) chambers, plasma and vacuum processing chambers, and ion implantation chambers, among others. FIG. 2 is a schematic cross-sectional view of a chamber component coating (CCC) chamber with a second example of a component support according to embodiments described herein. The CCC chamber 100 may be utilized with either of the component supports 105, 205. As illustrated, the CCC chamber 100 is configured to perform a CVD process, although in some embodiments, the CCC chamber 100 may be configured to perform another processing operation, such as a processing operation that involves plasma or another deposition process. The CCC chamber 100 is configured to support one or more chamber components such that the components may receive a coating via a deposition process, such as CVD.

The CCC chamber 100 includes a chamber body 102 and a lid 106 coupled to the chamber body 102. The CCC chamber 100 includes one of the component supports 105, 205 disposed therein. The component supports 105, 205 are fabricated from a graphite material or a silicon carbide material. In one example, the component support 105, 205 is coated with a carbon-containing material, such as silicon carbide (SiC). The chamber body 102 and the chamber lid 106 enclose the component support 105 in a processing volume 120 defined within the chamber body 102. An exhaust port 156 is disposed through the chamber body 102. The exhaust port 156 is coupled to a vacuum pump 157. The vacuum pump 157 removes excess process gases or by-products from the processing volume 120 via the exhaust port 156 during and/or after processing.

A gas supply source 111 is connected to the CCC chamber 100 and includes one or more gas sources. The gas supply source 111 is configured to deliver the one or more gases from the one or more gas sources to the processing volume 120. Each of the one or more gas sources provides a processing gas (such as argon, hydrogen or helium). In some embodiments, one or more of a carrier gas and an ionizable gas may be provided into the processing volume 120 along with one or more precursors. In some examples, a remote plasma source can be used to deliver plasma, formed from gases provided by the gas supply source 111 to the CCC chamber 100, to the processing volume 120 of the CCC chamber 100.

A showerhead 112 may be disposed in the processing volume 120 above the component support 105, 205. The showerhead 112 includes openings 118 for flowing process gas or gases into the processing volume 120 from the gas supply source 111. The process gases are supplied to the CCC chamber 100 via a gas feed 114, and the process gases enter a plenum 116 defined above the showerhead 112 prior to flowing through the openings 118. In some embodiments, different process gases that are flowed simultaneously during a processing operation enter the CCC chamber 100 via separate gas feeds and separate plenums prior to entering the processing volume 120 through the showerhead 112.

The CCC chamber 100 shown in FIG. 1 includes the component support 105. The CCC chamber 100 shown in FIG. 2 includes the component support 205. The component supports 105, 205 are configured to support one or more chamber components 107 during a CVD process performed in the CCC chamber 100. For example, the chamber components 107 may be any chamber component that requires a coating of material that can be applied via a CVD or other process performed within the CCC chamber 100. In one example, the chamber component 107 is a susceptor. In another embodiment, the chamber component 107 is a ring, such as a pre-heat ring, edge ring, shadow ring, clamp ring, cover ring or other type of ring utilized in a semiconductor processing chamber. The chamber component 107 may also be a showerhead, a liner, a shield, a support shaft, and the like.

The component supports 105, 205 are supported in the processing volume 120 of the CCC chamber 100. In one example, the component supports 105, 205 are supported by a portion of the chamber body 102. In another example, the component supports 105, 205 are coupled to or otherwise supported by sidewalls 104 of the chamber body 102. As shown in FIG. 1, the component support 105 is removably coupled to the sidewalls 104 via a sidewall fixture 110. As shown in FIG. 2, the component support 205 is directly coupled to the sidewalls 104. In some embodiments, the component supports 105, 205 are directly coupled to the sidewalls 104. In other embodiments, the component supports 105, 205 are coupled to the sidewalls 104 via the sidewall fixture 110. The sidewall fixture 110 extends from the sidewall 104 to the component supports 105, 205.

As shown in FIG. 1 and FIG. 2, the component supports 105, 205 are suspended above a bottom surface 122 of the chamber body 102. The component supports 105, 205 are suspended in the processing volume 120 between the lid 106 and the bottom surface 122, either via the sidewall fixture 110 or by directly coupling to the sidewalls 104. In other embodiments, which can be combined with other embodiments described herein, the component support 105, 205 sits directly on the bottom surface 122 or on another support disposed on the bottom surface 122. In one example, which can be combined with other embodiments described herein, the component support 105, 205 is permanently disposed within the processing volume 120. In another example, which can be combined with other embodiments described herein, the component support 105, 205 is able to be easily removed from the processing volume 120.

Although, FIG. 1 depicts only one component support 105 in the CCC chamber 100, one or more component supports 105 can be disposed in the CCC chamber 100. Although, FIG. 2 depicts only one component support 205 in the CCC chamber 100, one or more component supports 205 can be disposed in the CCC chamber 100.

In operation, the component support 105, 205 holds one or more chamber components 107 during a CVD process. In one embodiment, which can be combined with other embodiments described herein, the chamber components 107 are fabricated from a graphite material. In another embodiment, the chamber components 107 are fabricated from silicon carbide (SiC). The CVD process is utilized to coat the chamber components 107 with a material. For example, the chamber components 107 are coated with a carbon-containing material. In one example, the carbon-containing material may be silicon carbide (SiC), or tantalum carbide (TaC). It also contemplated that the carbon-containing material may be laminated on the chamber components 107 from layers of the same carbon-containing material or different carbon-containing materials.

The coating of material on the chamber components 107 improves the durability of the chamber components 107 by increasing the strength and hardness of the chamber components to reduce wear. Additionally, the coating of the chamber components 107 allows for improved chemical resistance and high temperature resistance of the chamber components 107. Also, the coating allows for improved thermal shock resistance, reduced thermal expansion, improved thermal conductivity, and reduced density, which improves the service life of the chamber components 107.

The chamber components 107 are contacted by the component support 105, 205 at fixture points 124. Each fixture point 124 has an area of contact on the chamber component 107 of about 0.2 $mm^2$ to about 100 $mm^2$. As such, coating the material onto the chamber components 107 at the fixture points 124 is challenging. Therefore, as described in more detail below, the component support 105, 205 contacts the chamber components 107 at fixture points 124 at locations that reduce the stress applied to the fixture points 124 via reactant gases and plasmas during semiconductor processing.

Figure 3:
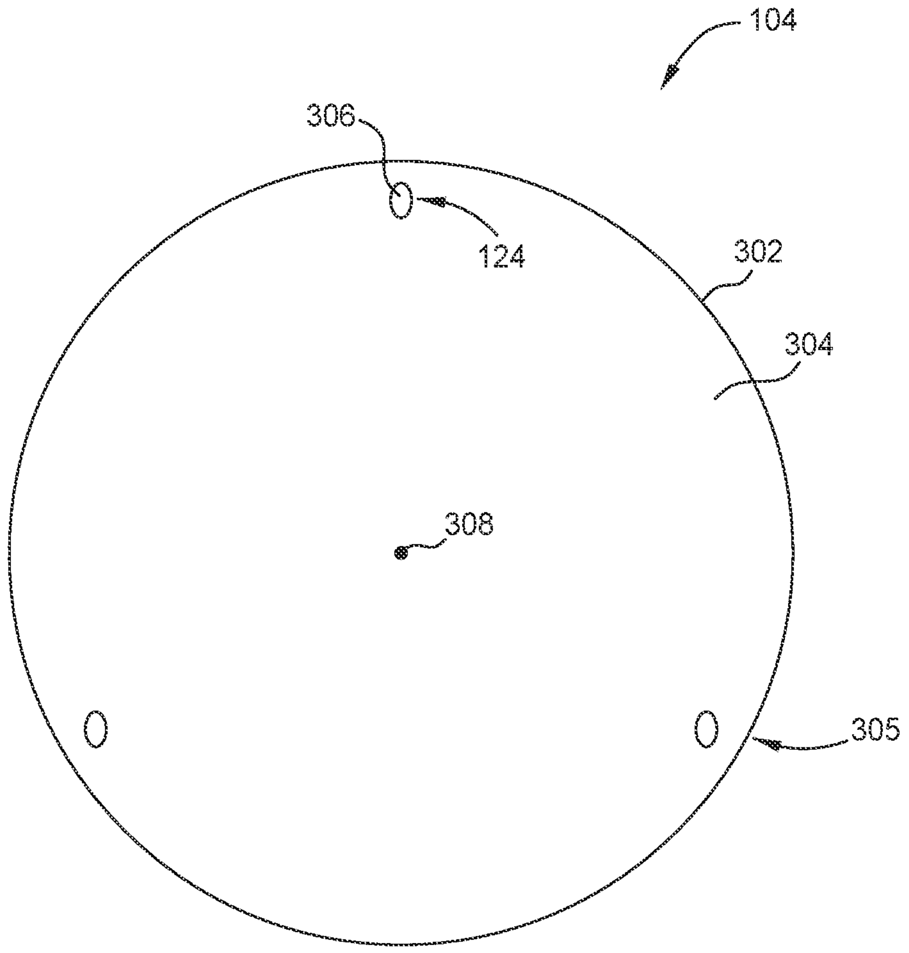
FIG. 3 is backside view of a susceptor according to embodiments described herein.

FIG. 3 is backside view of a susceptor according to embodiments described herein. The component support 105 is configured to support the chamber components 107 (e.g., susceptor 302) in the CCC chamber 100. The backside 304 is opposite a frontside 305 of the susceptor 302. The frontside 305 is configured to support a substrate during semiconductor processing. The backside 304 of the susceptor 302 includes one or more slots 306. The slots 306 are partially formed through the susceptor 302. The slots 306 are configured to define the fixture points 124 for the component support 105. The slots 306 are disposed radially around a center point 308 of the susceptor 302. Although FIG. 3 shows three slots 306, any number of slots 306 may be formed on the backside 304 of the susceptor 302. The shape of the slots 306 are not limited by the shape of the slots 306 shown in FIG. 3. For example, the slots 306 may have a circular, linear, triangular, square, rectangular or other suitable shape. Each slot 306 may have a different shape and/or orientation. By having the slots 306 and the fixture points 124 located on the backside 304 of the susceptor 302, reactant gas exposure at the fixture points 124 is reduced. The reactant gas is limited in contact on the backside 304 of the susceptor 302. A support shaft region is overlayed on the backside 304 of the susceptor 302. The support shaft region is defined as the region where a support shaft in the semiconductor processing chamber mates to the susceptor 302. The support shaft region is overlayed with the slots 306. Therefore, reactant gas exposure of the fixture points 124 is reduced due to the coverage by the support shaft region. As such, the lifetime of the susceptor 302 is increased.

Figure 4A:
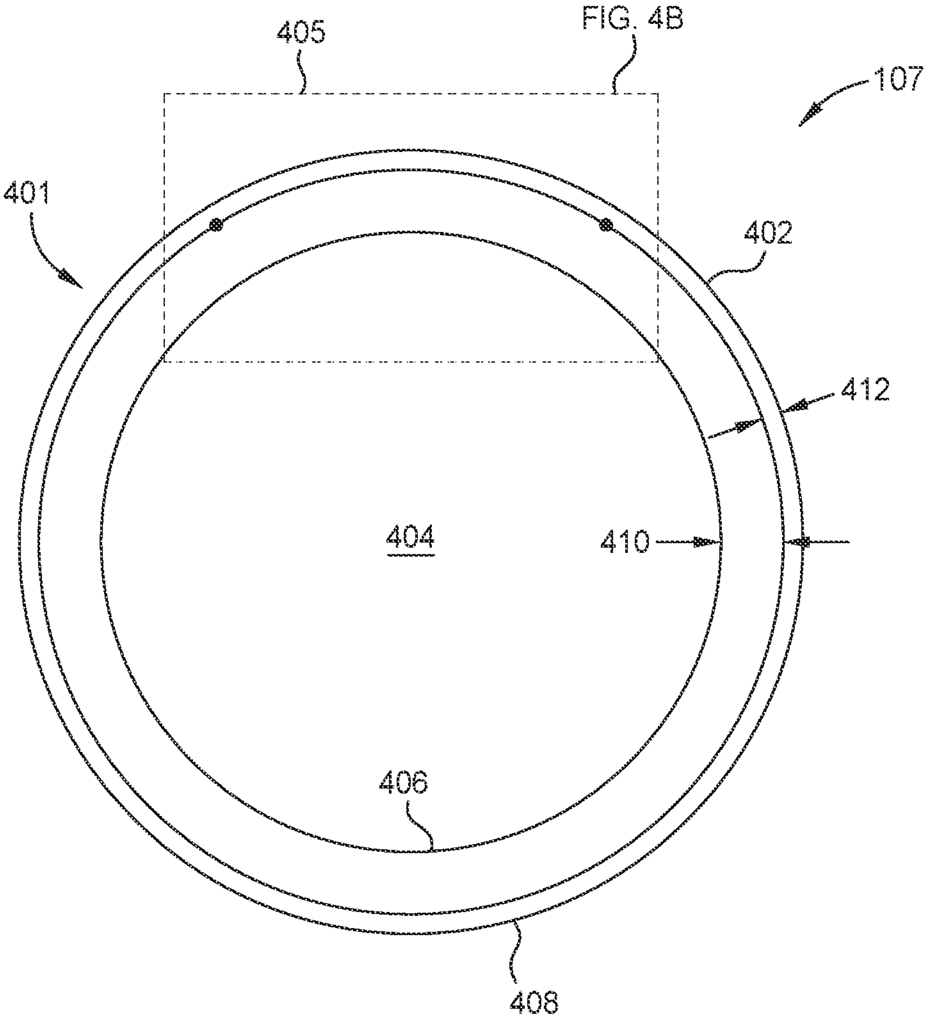
FIG. 4A is a backside view of a pre-heat ring according to embodiments described herein.

FIG. 4A is a backside view of a pre-heat ring 402 according to embodiments described herein. The component support 105 is configured to support the chamber components 107 (e.g., pre-heat ring 402) in the CCC chamber 100. The backside 401 of the pre-heat ring 402 is opposite a frontside 403 of the pre-heat ring 402. When installed in a semiconductor processing chamber for manufacturing substrates, the backside 401 faces towards the bottom of the chamber and away from the processing region. In one embodiment, the pre-heat ring 402 is designed to be positioned around the periphery of a substrate support. The pre-heat ring 402 facilitates pre-heating of the process gas as the process gas enters the processing volume 120 and flows over the pre-heat ring 402. The pre-heat ring 402 includes an annular region 404 which defines an inner circumference 406 of the pre-heat ring 402. An outer circumference 408 is radially outward of the inner circumference 406. The inner circumference 406 and the outer circumference 408 define the pre-heat ring 402. The backside 401 of the pre-heat ring 402 includes an inner portion 410 and an outer portion 412.

Figure 4B:
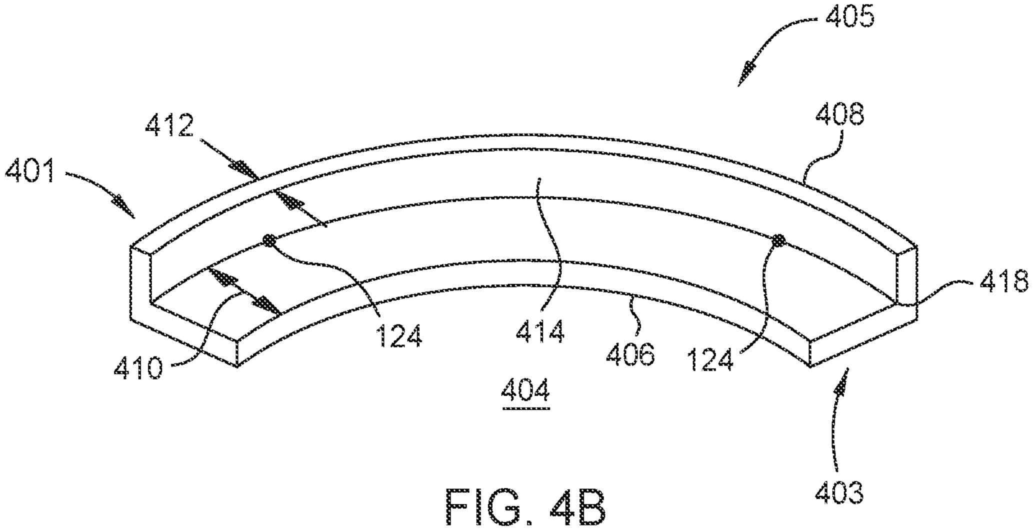
FIG. 4B is an isometric view of a portion of the pre-heat ring according to embodiments described herein.

FIG. 4B is an isometric view of a portion of the pre-heat ring according to embodiments described herein. The outer portion 412 extends away from the inner portion 410. The outer portion 412 forms a ledge 414 extending away from the inner portion 410. A corner 418 is defined as the intersection of the ledge 414 and the inner portion 410. The corner 418 forms a complete circle around the pre-heat ring 402. Fixture points 124 are located at the corner 418 of the pre-heat ring 402. Although FIG. 4B shows two fixture points 124, any number of fixture points 124 may be formed along the corner 418 of the pre-heat ring 402. The corner 418 interfaces with another surface of the semiconductor processing chamber when installed. As such, the fixture points 124 on the corner 418 are covered. By having the fixture points 124 covered and located on the backside 401 of the pre-heat ring 402, reactant gas exposure at the fixture points 124 is reduced. The reactant gas is limited in contact on the backside 401 of the pre-heat ring 402. As such, the lifetime of the pre-heat ring 402 is increased.

Figure 5A:
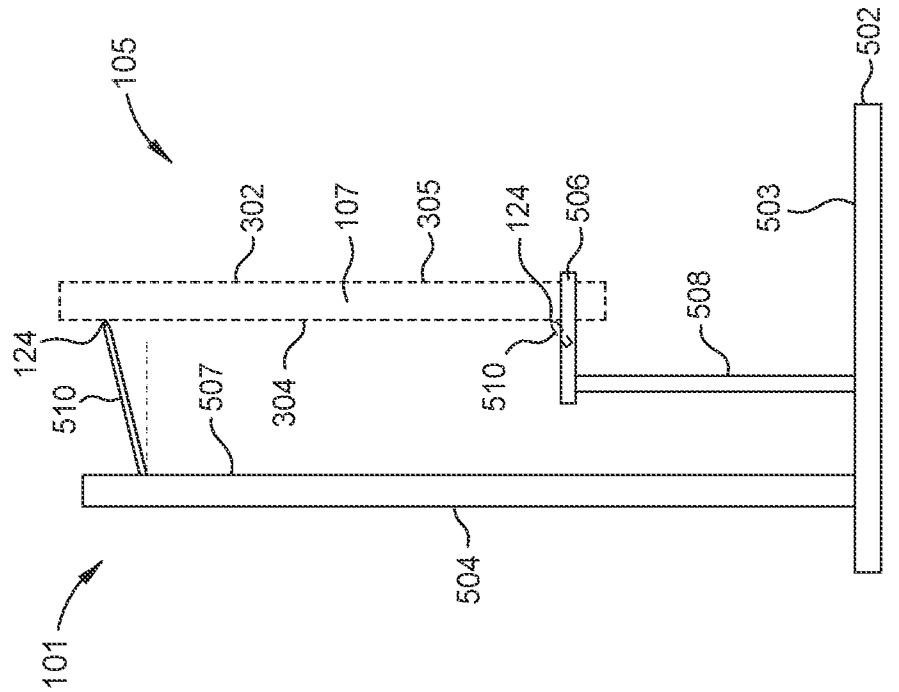
FIG. 5A is a schematic, side view of one example of a component support supporting a susceptor according to embodiments described herein.
Figure 5B:
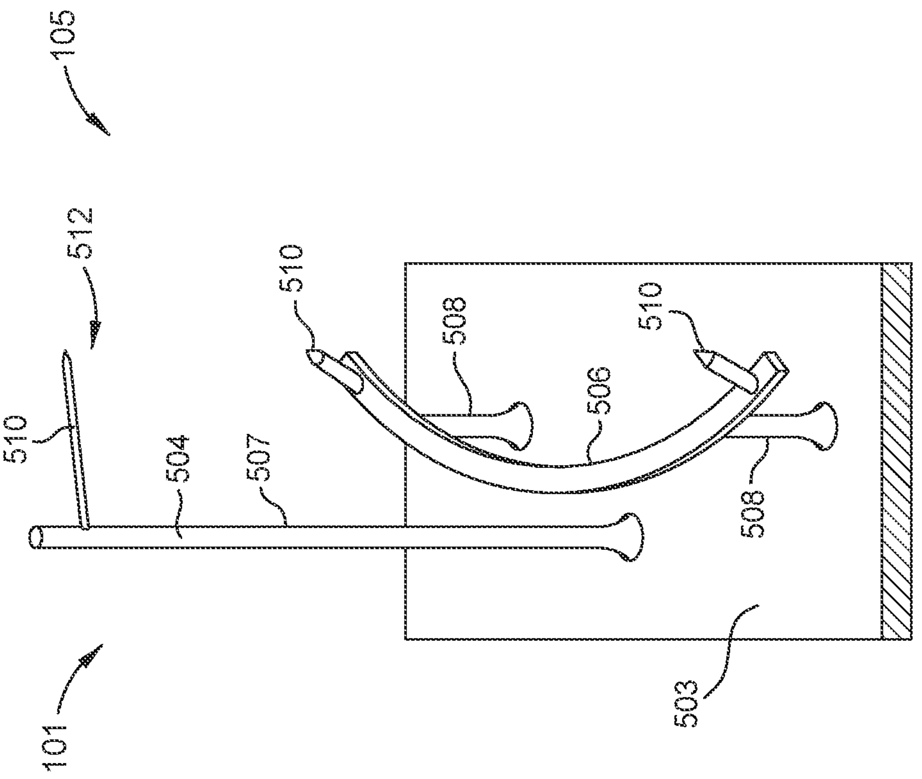
FIG. 5B is a schematic, perspective view of one example of a component support according to embodiments described herein.

FIG. 5A is a schematic, side view of one example of a component support supporting a susceptor according to embodiments described herein. FIG. 5B is a schematic, perspective view of one example of a component support according to embodiments described herein. The component support 105 is configured to support a chamber component 107, such as the susceptor 302 shown in FIG. 3. The component support 105 includes a base 502, a support rod 504, a support bar 506, legs 508, and contact rods 510. The support rod 504 and the legs 508 are coupled to the base 502. The support rod 504 and the legs 508 extend away from a top surface 503 of the base 502 in a vertical direction. The top surface 503 is horizontal. As shown in FIG. 1, in one example, the base 502 is coupled to the sidewalls 104 via a sidewall fixture 110. In another example, the base 502 is positioned on the bottom surface 122 of the chamber body 102.

The support bar 506 is coupled to the legs 508. In one example, the support bar 506 is curved. The support bar 506 may be curved toward the chamber component 107. In another example, the support bar 506 is straight. The support bar 506 includes one or more contact rods 510 coupled thereto. For example, as shown in FIGS. 5A and 5B, two contact rods 510 are coupled to the support bar 506. The support rod 504 includes a contact rod 510 coupled to a side surface 507 of the support rod 504. The support rod 504 is disposed a greater distance from the chamber component 107 than the support bar 506. In one example, the support bar 506 includes two contact rods 510 and the support rod 504 includes one contact rod 510.

Each of the contact rods 510 are configured to contact the backside 304 of the susceptor 302 at an individual fixture point 124 in order to support the susceptor 302. The component support 105 is configured to support the susceptor 302 such that the backside 304 is facing the top surface 503 of the base 502. The backside 304 is also facing a bottom surface 122 of the chamber body 102 (see FIG. 1). Stated differently, the component support 105 is configured to support the susceptor 302 such that the backside 304 is substantially, for example within 10 degrees, perpendicular to the top surface 503 of the base 502 and the bottom surface 122 of the chamber body 102.

The number of contact rods 510 corresponds with the number of slots 306 on the susceptor 302. The contact rods 510 are disposed at an angle relative to the top surface 503 of the base 502 (i.e., angled relative to a horizontal plane). For example, the contact rods 510 may be disposed at angle relative to the top surface 503 of the base 502 such that the contact rods 510 extend away from the top surface 503. The angle of the contact rods 510 allows for a more secure retention of the susceptor 302 with minimal contact on the susceptor 302. The angle of the contact rods 510 is between about 5° and about 95°. The contact rods 510 allow for the susceptor 302 to remain in contact with the component support 105. A contact point 512 located at the end of the contact rods 510 is shaped to ensure that the susceptor 302 remains in contact with the contact rods 510. The contact point 512 is positioned in contact with the slots 306. The weight of the susceptor 302 allows the contact rods 510 to support the susceptor 302 disposed thereon. The contact point 512 may be any one of a circular, rectangular, triangular, square, or other shape suitable to be in contact with the slots 306 of the susceptor 302. In some embodiments, which can be combined with other embodiments described herein, the base 502 of two adjacent component supports 105 can be coupled together. As such, multiple susceptors 302 can be retained. Although FIGS. 5A and 5B show three contact rods 510, the number of contact rods 510 may be adjusted to correspond with the number of slots 306 on the susceptor 302.

Figure 6:
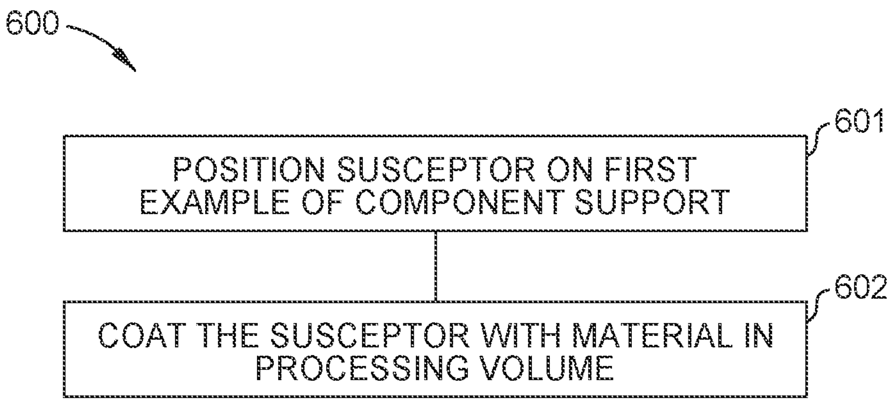
FIG. 6 is a flow diagram of a method of supporting a chamber component in a chamber component coating (CCC) chamber during a coating process according to embodiments described herein.

FIG. 6 is a flow diagram of a method of supporting a chamber component in a chamber component coating (CCC) chamber during a coating process according to embodiments described herein. To facilitate explanation, the method 600 is described with reference to the CCC chamber 100 shown in FIG. 1, however other chambers suitable for coating a chamber component may be utilized in conjunction with the method 600. The method 600 is described with reference to coating a chamber component 107 while supported by a component support 105. The chamber component 107 may be a susceptor 302, as shown in FIG. 3. In one example, the component support 105 may be as shown in FIGS. 5A and 5B or have another suitable configuration.

At operation 601, a susceptor 302 is positioned on the component support 105. The component support 105 is disposed in a processing volume 120 of CCC chamber 100. The susceptor 302 includes one or more slots 306 (see FIG. 3) disposed on a backside 304 of the susceptor 302. The slots 306 are aligned with contact rods 510 of the component support 105. Contact points 512 of the contact rods 510 contact the slots 306 in order to support the susceptor 302 within the processing volume 120. The contact points 512 contact the slots 306 at fixture points 124. The fixture points 124 are the only location on the susceptor 302 being contacted. The component support 105 is configured such that the fixture points 124 are on the backside 304 of the susceptor 302. It is contemplated that more than one susceptors 302 are positioned on other component supports 105 disposed in the processing volume 120 for subsequent coating operations.

At operation 602, the susceptor 302 is coated with a material inside of the processing volume 120. The susceptor 302 is coated with a carbon-containing material, such as silicon carbide, tantalum carbide or the like. The susceptor 302 is coated with the carbon-containing material in order to protect the susceptor 302 from reactant gas in future processing steps. For example, carbon-containing gas sources provide carbon-containing gas accompanied with a carrier gas. The carrier gas may be a single gas or a gas mixture. The carbon-containing gas is processed at a temperature above 1000° C.-1500° C. at atmospheric or reduced pressures.

In some embodiments, after the operation 602, the susceptor 302 is installed in a semiconductor processing chamber. The semiconductor processing chamber may be a chamber utilized in the manufacture of semiconductor substrates. The susceptor 302 may be used to support a substrate in the semiconductor processing chamber. The susceptor 302 may be exposed to reactant gas within the semiconductor processing chamber. A function of the fixture points 124 being located on the backside 304 of the susceptor 302 is the reactant gas exposure at the fixture points 124 is reduced. For example, the support shaft region, defining where a support shaft interfaces with the susceptor 302, covers the fixture points 124. The support shaft region is overlayed with the slots 306. The reactant gas is limited in contact on the backside 304 of the susceptor 302. Therefore, if the carbon-containing material is not sufficiently coated at the fixture points 124, the reactant gas will be less likely to damage the susceptor 302 at the fixture points 124. As such, the lifetime of the susceptor 302 is increased.

Figure 7A:
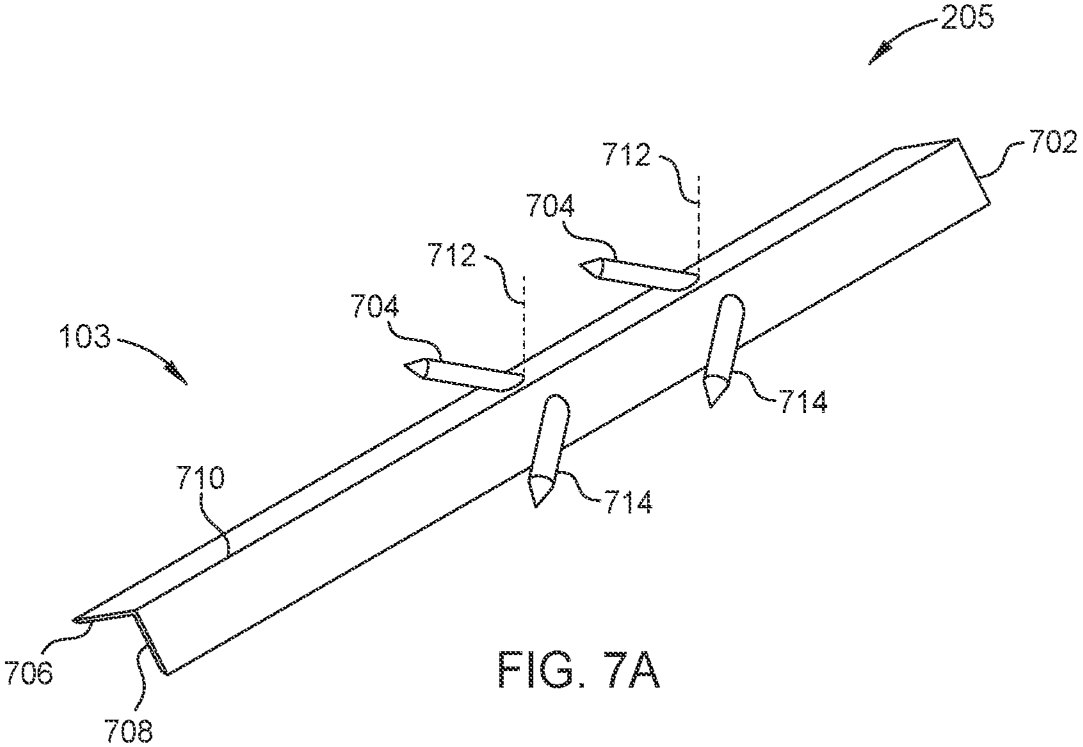
FIG. 7A is a schematic, perspective view of another example of a component support supporting a pre-heat ring according to embodiments described herein.
Figure 7B:
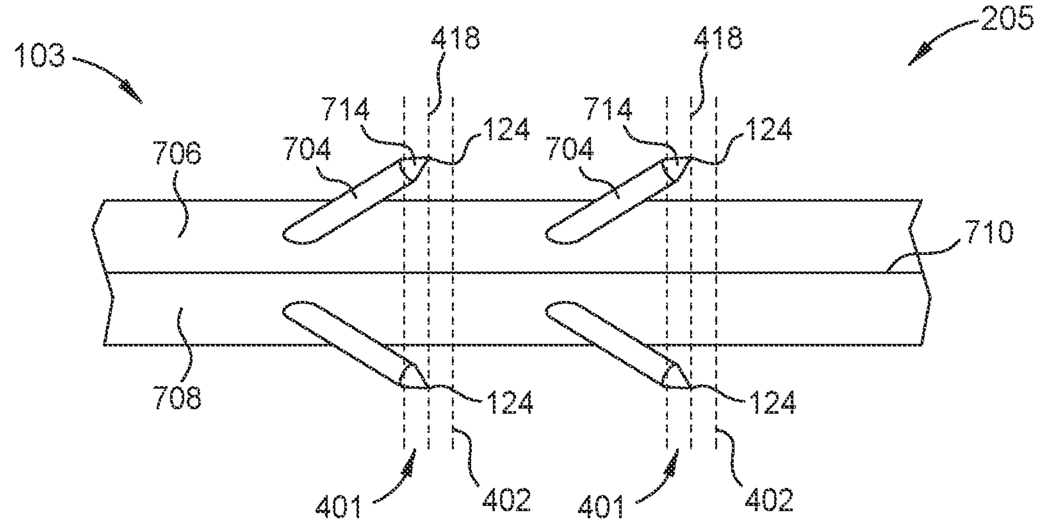
FIG. 7B is a schematic, top view of another example of a component support according to embodiments described herein.

FIG. 7A is a schematic, perspective view of another example of a component support supporting a pre-heat ring according to embodiments described herein. FIG. 7B is a schematic, top view of another example of a component support according to embodiments described herein. In one example, the component support is the component support 205 which is configured to support a chamber component 107, such as the pre-heat ring 402 shown in FIGS. 4A and 4B. The component support 205 includes a support rod 702 with one or more contact rods 704 extending from the support rod 702. The contact rods 704 are coupled to the support rod 702. For example, the contact rods 704 may be welded to the support rod 702 or screwed to the support rod 702. The support rod 702 may be directly coupled to the sidewalls 104. Alternatively, a support sitting on the bottom surface 122 of the chamber body 102 is coupled to the support rod 702 to position the component support 205 in the processing volume 120.

The support rod 702 is disposed in the processing volume 120 of the CCC chamber 100 (see FIG. 2). The support rod 702 includes a first portion 706 and a second portion 708. The first portion 706 and the second portion 708 are coupled at a meeting point 710. The meeting point 710 is horizontal within the CCC chamber 100. The support rods 702 may be positioned on one or both of the first portion 706 and the second portion 708.

In one embodiment, which can be combined with other embodiments described herein, as shown in FIG. 7A, the first portion 706 and the second portion 708 are non-parallel to each other. In another embodiment, which can be combined with other embodiments described herein, the first portion 706 and the second portion 708 are parallel and connected at the meeting point 710 to form a flat plate. The one or more contact rods 704 extend from the support rod 702. The one or more contact rods 704 are disposed at an angle relative to a vertical axis 712. A pair of contact rods 704 are configured to support a pre-heat ring 402. However, it is contemplated that a single contact rod 704 is suitable to support a pre-heat ring 402. The contact rods 704 contact a corner 418 (see FIG. 4B) on the backside 401 of the pre-heat ring 402 at fixture points 124. The number of contact rods 704 corresponds with the number of fixture points 124. The angle of the contact rods 704 allows for a more secure retention of the pre-heat ring 402 on the corner 418 with minimal contact on the pre-heat ring 402. The angle of the contact rods 704 is between about 10° and about 90° relative to the vertical axis 712. The contact rods 704 allow for the pre-heat ring 402 to remain in contact with the component support 205.

The component support 205 is configured to support the pre-heat ring 402 such that the backside 401 is facing (or substantially perpendicular to) a bottom surface 122 of the chamber body 102 (see FIG. 1). A contact point 714 located at the end of the contact rods 704 is shaped to ensure that the pre-heat ring 402 remains in contact with the contact rods 704. The contact point 512 is positioned in contact with the corner 418. The weight of the pre-heat ring 402 allows the contact rods 704 to support the pre-heat ring 402 disposed thereon. The contact point 714 may be any one of a circular, rectangular, triangular, square, or other shape suitable to be in contact with the corner 418 of the pre-heat ring 402. In some embodiments, which can be combined with other embodiments described herein, multiple support rods 702 may be disposed in the processing volume 120. As such, multiple susceptors 302 can be retained. Although FIGS. 5A and 5B show four contact rods 704, the number of contact rods 704 may be adjusted to correspond with the number of pre-determined fixture points 124 on the pre-heat ring 402. Although FIGS. 5A and 5B show two pre-heat rings 402, the number of pre-heat rings 402 may be adjusted and is not limited by FIGS. 5A and 5B.

Figure 8:
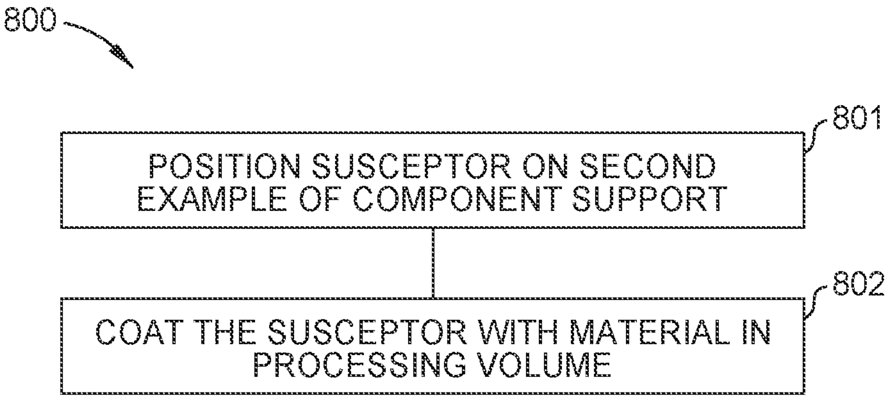
FIG. 8 is a flow diagram of a method of supporting a chamber component in a chamber component coating (CCC) chamber during a coating process according to embodiments described herein.

FIG. 8 is a flow diagram of a method of supporting a chamber component in a chamber component coating (CCC) chamber during a coating process according to embodiments described herein. To facilitate explanation, the method 800 is described with reference to the CCC chamber 100 shown in FIG. 2, however other chambers suitable for coating a chamber component may be utilized in conjunction with the method 800. The method 800 is described with reference to coating a chamber component 107 while supported by a component support 205. The chamber component 107 may be a pre-heat ring 402, as shown in FIGS. 4A and 4B. The component support 205 may be as shown in FIGS. 7A and 7B, or have another suitable configuration.

At operation 801, a pre-heat ring 402 is positioned on the component support 205. The component support 205 is disposed in a processing volume 120 of a CCC chamber 100. The pre-heat ring 402 includes a corner 418 disposed on a backside 401 of the pre-heat ring 402. Contact rods 704 of the component support 205 contact the corner 418 of the pre-heat ring 402. Contact points 714 of the contact rods 704 contact the corner 418 in order to support the pre-heat ring 402 within the processing volume 120. The contact points 714 contact the corner 418 at fixture points 124. The fixture points 124 are the only location on the pre-heat ring 402 being contacted. The component support 205 is configured such that the fixture points 124 are on the backside 401 of the pre-heat ring 402. It is contemplated that more than one pre-heat rings 402 are positioned on other contact rods 704 disposed along the support rod 702 within the processing volume 120.

At operation 802, the pre-heat ring 402 is coated with a material inside of the processing volume 120. The pre-heat ring 402 is coated with a carbon-containing material, such as silicon carbide or tantalum carbide. The pre-heat ring 402 is coated with the carbon-containing material in order to protect the pre-heat ring 402 from reactant gas in future processing steps. For example, carbon-containing gas sources provide carbon-containing gas accompanied with a carrier gas. The carrier gas may be a single gas or a gas mixture. The carbon-containing gas is processed at a temperature above 1000° C.-1500° C. at atmospheric or reduced pressures.

In some embodiments, after the operation 602, the pre-heat ring 402 is installed in a semiconductor processing chamber. The semiconductor processing chamber may be a chamber utilized in the manufacture of semiconductor substrates. The pre-heat ring 402 may be exposed to reactant gas within the semiconductor processing chamber. A function of the fixture points 124 being located on the backside 401 of the pre-heat ring 402 is the reactant gas exposure at the fixture points 124 is reduced. The reactant gas is limited in contact on the backside 401 of the pre-heat ring 402. Therefore, if the carbon-containing material is not sufficiently coated at the fixture points 124, the reactant gas will be less likely to damage the pre-heat ring(s) 402 at the fixture points 124. As such, the lifetime of the pre-heat ring 402 is increased.

In summation, embodiments of the present disclosure relate to a component support for use in coating chamber components via chemical vapor deposition (CVD). The component support includes contact rods configured to contact chamber components at fixture points located on the backside of the chamber components. The component supports are configured to support the chamber components in the processing volume with minimal contact of the chamber components. The fixture points on the backside reduce exposure of the fixture points to reactant gases when the chamber components are installed. Therefore, if the carbon-containing material is not sufficiently coated at the fixture points, the reactant gas will be less likely to damage the components at the fixture points. As such, the lifetime of the chamber components is increased.

While the foregoing is directed to embodiments of the present invention, other and further embodiments of the invention may be devised without departing from the basic scope thereof, and the scope thereof is determined by the claims that follow.

What is claimed is:

1. A method of coating a chamber component, comprising:

positioning a chamber component on a component support in a chamber body, wherein one or more contact rods extending from a support rod of the component support contact the chamber component at one or more fixture points, wherein the chamber component includes:

an inner portion forming a ring shape; and an outer portion surrounding the inner portion, wherein the inner portion extends away from the outer portion to form a ledge such that the one or more fixture points are located on a corner formed on the chamber component, the corner defined as an intersection of the ledge and the inner portion; and coating the chamber component with a carbon-containing material while the chamber component is supported on the component support at the one or more fixture points, wherein the chamber component is facing a bottom surface of the chamber body; and installing the chamber component into a semiconductor processing chamber, wherein the corner interfaces with one or more surfaces of the semiconductor processing chamber.

2. The method of claim 1, further comprising positioning a second chamber component on the component support and coating the second chamber component with the carbon-containing material.

3. The method of claim 1, further comprising positioning a second chamber component on a second component support in the chamber body and coating the second chamber component with the carbon-containing material.

4. The method of claim 1, wherein the chamber component is a pre-heat ring.

5. The method of claim 1, wherein the carbon-containing material is silicon carbide (SiC) or tantalum carbide (TaC).

6. The method of claim 1, wherein the one or more contact rods are disposed at an angle relative to a vertical axis, wherein the angle of the one or more contact rods is between about 10° and about 90°.

* * * * *